US005968327A

United States Patent [19]
Kobayashi et al.

[11] Patent Number: 5,968,327

[45] Date of Patent: Oct. 19, 1999

[54] IONIZING SPUTTER DEVICE USING A COIL SHIELD

[75] Inventors: Masahiko Kobayashi; Nobuyuki Takahashi, both of Kanagawa-ken, Japan

[73] Assignee: Anelva Corporation, Fuchu, Japan

[21] Appl. No.: 09/022,623

[22] Filed: Feb. 12, 1998

[30] Foreign Application Priority Data

Apr. 14, 1997 [JP] Japan .................................... 9-111902

[51] Int. Cl.[6] ..................................................... C23C 14/34

[52] U.S. Cl. ................................ 204/298.11; 204/298.06; 204/298.08

[58] Field of Search .......................... 204/298.06, 298.11, 204/298.07, 298.08, 298.15

[56] References Cited

U.S. PATENT DOCUMENTS

| | | | |
|---|---|---|---|
| 5,178,739 | 1/1993 | Barnes et al. . | |
| 5,397,962 | 3/1995 | Moslehi | 315/111.51 |
| 5,431,799 | 7/1995 | Mosely et al. | 204/298.06 |
| 5,545,978 | 8/1996 | Pontius . | |
| 5,707,398 | 1/1998 | Ngan | 204/192.12 |
| 5,763,851 | 7/1996 | Forster et al. | 219/121.43 |
| 5,800,619 | 6/1996 | Holland et al. | 118/723 I |
| 5,800,688 | 4/1997 | Lantsman et al. | 204/298.11 |
| 5,903,106 | 5/1999 | Young et al. | 315/111.41 |

FOREIGN PATENT DOCUMENTS

WO92/07969 5/1992 WIPO .

OTHER PUBLICATIONS

Magnetron Sputter Deposition for Interconnect Applications; S.M. Rossnagel; Conference Proceedings ULSI XI; 1996 Materials Research Society; pp. 227–232.

Ionized Magnetron Sputtering for Lining and Filling Trenches and Vias; S.M. Rossnagel; Semiconductor International; Feb. 1996; pp. 99–102.

*Primary Examiner*—Nam Nguyen
*Assistant Examiner*—Julian A. Mercado
*Attorney, Agent, or Firm*—Burns, Doane, Swecker & Mathis, LLP

[57] ABSTRACT

A coil shield 64 that blocks the arrival at a substrate 50 of the material released by sputtering is provided to a high frequency coil 61 provided such that it surrounds the ionization space between the target 2 and the substrate holder 5. The coil shield 64 is made of metal, and is grounded, which prevents plasma formation in unnecessary places. The coil shield 64 is hollow, gas blowing holes are uniformly formed over the inner surface facing the ionization space, and the gas is flown toward the ionization space.

16 Claims, 4 Drawing Sheets

IONIZING SPUTTER DEVICE USING A COIL SHIELD

This application claims priority under 35 U.S.C. §§119 and/or 365 to Appln. No. 9-111902 filed in Japan on Apr. 14, 1997; the entire content of which is hereby incorporated by reference.

BACKGROUND OF THE INVENTION

1. Field of the Invention

The present invention relates to a sputtering device used in the fabrication of various types of semiconductor devices. More particularly, it relates to an ionizing sputtering device having a function that ionizes the sputter particles.

2. Description of Related Art

With semiconductor devices, such as various types of memory and logic, a sputtering process is used in the formation of various wiring films, and in the production of barrier films that prevent the interdiffusion of different layers. A sputtering process makes use of a sputtering device, and there has recently been a great need for such sputtering devices to allow the inner surfaces of holes formed in a substrate to be coated with a good degree of coverage.

Recently, there has been a need in the case of barrier films for an increase in the bottom coverage, which is the ratio of the film deposition on the bottom of a hole to that on the peripheral surfaces of the hole. With today's higher degrees of integration, holes such as contact holes have been steadily increasing in aspect ratio, which is the ratio of the hole depth to the size of the hole opening. A film cannot be deposited with good bottom coverage by a conventional sputtering process. A decrease in the bottom coverage can lead to a thinner barrier film at the bottom of the hole and to critical flaws in the device characteristics, such as junction leakage.

Collimation sputtering, and low-pressure, long-distance sputtering, have been developed up to now as sputtering processes that increase the bottom coverage. These processes will not be described in detail here, but they all attempt to direct many neutral sputter particles perpendicularly at the substrate.

A problem with collimation sputtering, however, is that sputter particles accumulate on the collimator portion, and the resulting loss of material decreases the film deposition rate. A problem with low-pressure, long-distance sputtering is that since the pressure is lowered and the distance between the target and the substrate is lengthened, there is a fundamental decrease in the film deposition rate. Because of these problems, the first generation is about as far as these processes are expected to go, or up to 64 megabits with collimation sputtering and 256 megabits with low-pressure, long-distance sputtering.

There is a need for a practical process that can be utilized in the production of devices over 256 megabits. In response to this need, there has been speculation that ionizing sputtering might be a useful process. Ionizing sputtering is a process in which the sputter particles released from the target are ionized, and the sputter particles are made to arrive inside the hole more efficiently through the action of these ions. Ionizing sputtering yields a higher bottom coverage than collimation sputtering or low-pressure, long-distance sputtering.

Typically, ionizing sputtering involves forming a plasma along the flight path of the sputter particles between the substrate and the target, and ionizing the sputter particles as they pass through the plasma. An inductive coupling type of plasma is usually formed as this plasma. In specific terms, a high frequency coil is provided such that it surrounds the space where the ionization is performed along the flight path, hereinafter referred to as the ionization space. Constant high frequency waves are supplied to this high frequency coil to form a plasma on the inside of the high frequency coil. High frequency current flows into the plasma, and the plasma and the high frequency coil are inductively coupled. It is because of this action that this plasma is called an inductive coupling type of plasma.

SUMMARY AND OBJECTS

However, conventional ionizing sputtering is plagued by the following problems:

First, the high frequency coil is usually installed inside the sputter chamber in order to set up a sufficiently strong high frequency electric field. The high frequency coil is sputtered by the plasma, and the sputtered material from the high frequency coil reaches the substrate, as a result of which the substrate is fouled.

Second, since the gas diffuses into the sputter chamber, there are cases when the plasma is formed on the outside of the high frequency coil, as well. The plasma formed at these places is not only not needed for the ionization, but can actually damage the members located in these places.

Third, when a plasma is formed, the structure of the optimal gas introduction for sputter discharge differs from that of the optimal gas introduction for forming the ionizing plasma. The gas for forming the plasma cannot be supplied efficiently, so plasma formation efficiency suffers.

The present invention was conceived in an effort to solve these problems, and an object thereof is to provide a practical ionizing sputtering device that is effective in the production of second generation devices, and that solves the above problems encountered with ionizing sputtering.

These objects may be accomplished with an ionizing sputtering device that includes a sputter chamber equipped with a vacuum pump system; a target provided inside the sputter chamber; a sputtering electrode for sputtering the target; gas introduction means for introducing a gas into the sputter chamber; ionization means for ionizing sputter particles released from the target by sputtering, the ionization means includes a high frequency coil provided inside the sputter chamber so as to surround a space between the target and the substrate holder, and a high frequency power source that forms a high frequency inductive coupling type of plasma in the space by supplying high frequency waves to the high frequency coil; a substrate holder for holding a substrate in a position where the sputter particles land; and a coil shield provided on the high frequency coil, the coil shield arranged so as to block the arrival at the substrate of sputter particles composed of the material of the high frequency coil that are sputtered and released by said high frequency coil.

These objects may also be accomplished with an ionizing sputtering device that includes a sputter chamber equipped with an exhaust system; a target provided inside the sputter chamber; a sputtering electrode for sputtering the target; gas introduction means for introducing a gas into the sputter chamber; ionization means for ionizing sputter particles released from the target by sputtering, the ionization means includes a high frequency coil provided inside the sputter chamber so as to surround a space between the target and the substrate holder, and a high frequency power source that forms a high frequency inductive coupling type of plasma in the space by supplying high frequency waves to the high frequency coil, and the high frequency coil is formed from a same material as the target, which is a material of a thin film to be produced on the substrate; a substrate holder for holding a substrate in a position where the sputter particles land; and an auxiliary shield is provided to an outside of the high frequency coil, and the auxiliary shield is formed from a metal member and is electrically grounded, and encloses the plasma on the inside of the high frequency coil.

These objects may also be accomplished with an ionizing sputtering device that includes a sputter chamber equipped with an exhaust system; a target provided inside the sputter chamber; a sputtering electrode for sputtering the target; gas introduction means for introducing a gas into the sputter chamber; ionization means for ionizing the sputter particles released from the target by sputtering, the ionization means includes a hollow high frequency coil provided inside the sputter chamber so as to surround a space between the target and the substrate holder, and a high frequency power source that forms a high frequency inductive coupling type of plasma in the space by supplying high frequency waves to this high frequency coil; a substrate holder for holding a substrate in a position where the sputter particles land; the hollow high frequency coil includes gas blowing holes formed uniformly over an inner surface thereof so as to face the space so that a specific gas can be introduced into the space through the gas blowing holes.

DETAILED DESCRIPTION OF THE PREFERRED EMBODIMENTS

Preferred embodiments of the present invention will now be described.

Figure 1:
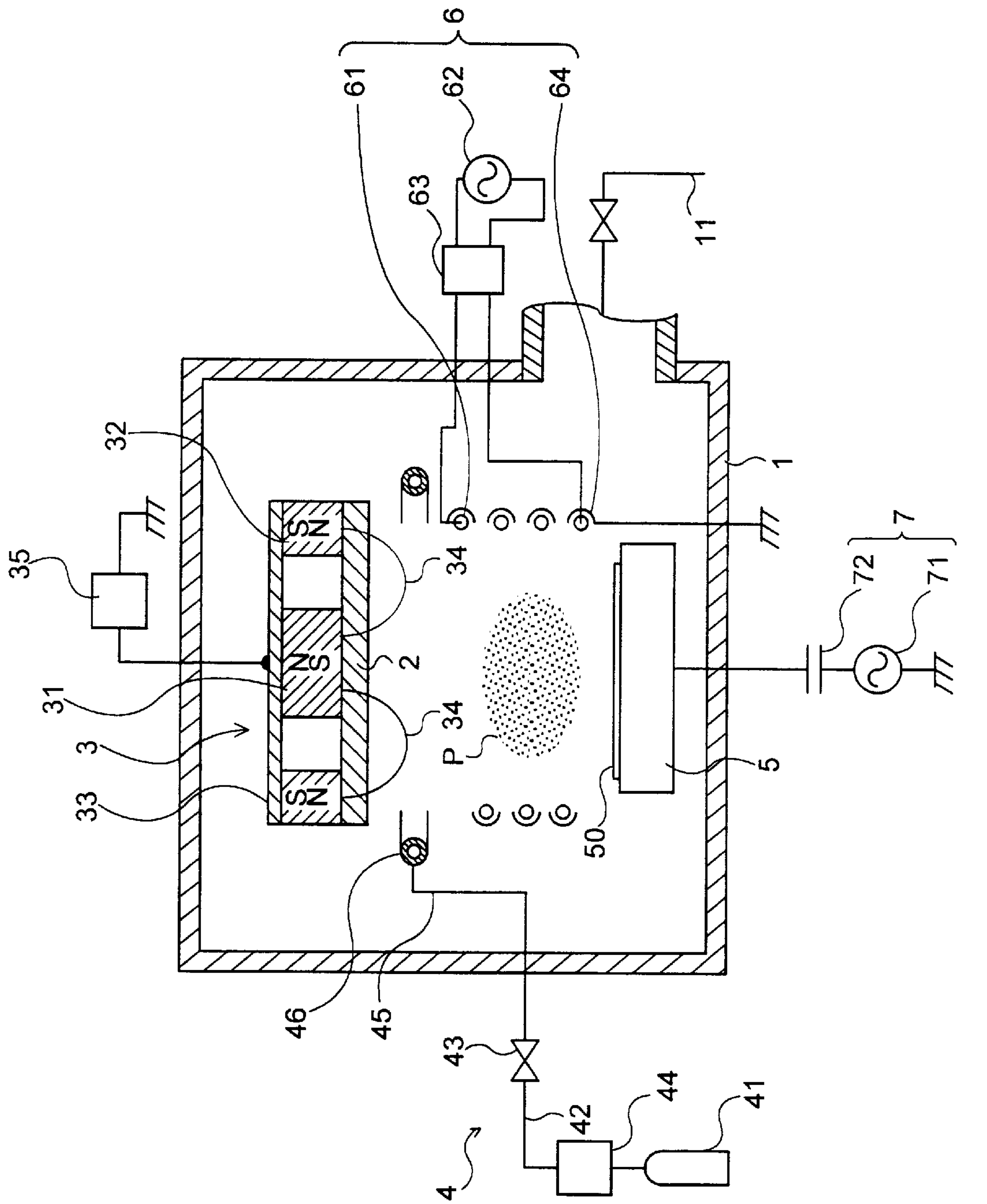
FIG. 1 is a simplified front view of the structure of the sputtering device in a first embodiment of the present invention.

FIG. 1 is a simplified front view of the structure of a sputtering device in a first embodiment of the present invention.

As shown in FIG. 1, the sputtering device in this embodiment has a sputter chamber 1 equipped with a vacuum pump system 11. The sputter chamber 1 has a target 2 provided on its inside, a sputtering electrode 3 that sputters this target 2, and a gas introduction means 4 for introducing a sputter gas into the sputter chamber 1. In order for the sputter particles released from the target 2 by sputtering to be ionized, the sputter chamber 1 further comprises an ionization means 6, and an electric field establishment means 7 for setting up an electric field in the direction perpendicular to a substrate 50 in order to pull the ionized sputter particles into the substrate 50. The ionized sputter particles are directed at the substrate 50, which is held on a substrate holder 5.

The sputter chamber 1 is an airtight vessel equipped with a gate valve, not shown. This sputter chamber 1 is made of a metal such as stainless steel, and is electrically grounded.

The vacuum pump system 11 is a multi-stage vacuum pump furnished with a turbo molecular pump or a diffusion pump. The vacuum pump system 11 is capable of pumping out the inside of the sputter chamber 1 down to about $10^{-8}$ to $10^{-9}$ Torr. The vacuum pump system 11 is equipped with a pumping speed adjuster, not shown, such as a variable orifice, which allows the pumping speed to be adjusted.

The target 2 is in the form of a disk that is 6 mm thick and about 300 mm in diameter. The target 2 is attached to the sputtering electrode 3 via a target holder, not shown.

The sputtering electrode 3 is a magnetron cathode equipped with a magnet assembly. The magnet assembly consists of a center magnet 31, a peripheral magnet 32 that surrounds the center magnet 31, and a disk-shaped yoke 33 that ties the center magnet 31 to the peripheral magnet 32. The magnets are both permanent magnets, but they can instead comprise electromagnets.

The sputtering electrode 3 is attached to the sputter chamber 1 in an insulated state, and a sputtering power source 35 is connected. The sputtering power source 35 applies the desired negative voltage or a high frequency voltage to the sputtering electrode 3. When titanium is being sputtered, a negative, direct current voltage of about 600 V is applied.

The gas introduction means 4 primarily consists of a gas cylinder 41 filled with argon or another sputtering discharge gas, and a gas distributor 46 connected to the distal end of an in-chamber tube 45. The gas cylinder 41 and the sputter chamber 1 are linked by a tube 42. A valve 43 and flux adjuster 44 are attached to the tube 42. The in-chamber tube 45 is linked to the distal end of the tube 42.

An annular pipe that has gas blowing holes formed in its central side surface is employed for the gas distributor 46. The gas distributor 46 uniformly introduces gas into the space between the target 2 and the substrate holder 5.

In this embodiment, the ionization means 6 forms an inductive coupling type of high frequency plasma along the flight path of the titanium from the target 2 to the substrate 50. The ionization means 6 primarily consists of a high frequency coil 61 provided such that it surrounds the ionization space between the target 2 and the substrate holder 5, and a high frequency power source 62 connected to the high frequency coil 61 via a matching box 63.

The high frequency coil 61 comprises a metal rod about 10 mm thick that has been molded into a roughly spiral shape, and the radial distance from the center axis of the sputter chamber 1 to the high frequency coil 61 is about 150 to 250 mm. Since a coil shield 64, discussed below, is provided to the high frequency coil 61 in this embodiment, there are no particular restrictions on the material of the high frequency coil 61. A material that efficiently excites high frequency waves, such as titanium, is used for the high frequency coil 61.

The high frequency power source 62 has a frequency of 13.56 MHz and an output of about 5 kW. High frequency power is supplied to the high frequency coil 61 via a matching box 63. A high frequency electric field is set up in the ionization space by the high frequency coil 61. The gas introduced by the gas introduction means 4 is converted into a plasma by this high frequency electric field, forming a plasma P. A high frequency current is allowed to flow into the plasma P, and the plasma P and the high frequency coil 61 are inductively coupled.

As the sputter particles released from the target 2 pass through the plasma P, they strike the electrons in the plasma P and are ionized. The ionized sputter particles are accelerated by the electric field, as discussed below, and thereby arrive at the substrate 50.

The substrate holder 5 holds the substrate 50 parallel to the target 2. The substrate holder 5 may be provided with a heating mechanism, not shown, for heating the substrate 50 during film deposition to deposit a film more efficiently. The substrate holder 5 may also be provided with an electrostatic chucking mechanism, not shown, for electrostatically attracting the substrate 50.

In this embodiment, the electric field establishment means 7 imparts a negative bias voltage to the substrate 50 by applying a constant high frequency voltage to the substrate holder 5. The electric field establishment means 7 comprises a substrate-biasing high frequency power source 71 that is connected to the substrate holder 5 via a blocking capacitor 72.

The substrate-biasing high frequency power source 71 is one with a frequency of 13.56 MHz and an output of about 300 W. When high frequency voltage is applied to the substrate 50 by the substrate-biasing high frequency power source 71, the charged particles within the plasma P are periodically attracted to the surface of the substrate 50. Electrons, with their higher degree of mobility, are attracted to the surface of the substrate 50 in greater number than positive ions, as a result of which the surface of the substrate 50 is in the same state as if it were biased to a negative potential. In specific terms, in the case of the electric field establishment means 71 used in this example, a bias voltage of about −100 V can be imparted on average to the substrate 50.

The state in which the above-mentioned substrate bias voltage has been imparted is the same as that in a cathode sheath region when a plasma is formed by direct current diode discharge, and is a state in which an electric field having a potential gradient that drops toward the substrate 50, hereinafter referred to as an extraction-use electric field, is set up between the plasma and the substrate 50. This extraction-use electric field causes the ionized sputter particles, which may be positive ions of titanium, to be extracted from the plasma and arrive at the substrate 50 more efficiently.

When the target 2 is a metal, the above-mentioned substrate holder 5 is made from the same metal material as the target 2, and when the target 2 is a dielectric, the substrate holder 5 is made from a metal that is heat resistant, such as stainless steel. In any case, the substrate holder 5 is made of a metal, and therefore in principle no direct current electric field exists within the placement plane of the substrate holder 5. The above-mentioned extraction-use electric field is only an electric field that faces perpendicular to the substrate 50, and acts to accelerate the ionized sputter particles perpendicularly to the substrate 50. This allows the ionized sputter particles to make it all the way to the bottom of the hole formed in the substrate 50 more efficiently.

The structure of the coil shield 64, will now be described. This embodiment is provided with a coil shield 64 that blocks the arrival at the substrate 50 of the material of the high frequency coil 61 that has been sputtered and released from the high frequency coil 61.

As shown in FIG. 1, the coil shield 64 is formed so as to cover the periphery of the high frequency coil 61 except for a portion of the high frequency coil 61 on the inside. The coil shield 64 has a cylindrical cross section that is concentric with the cross section of the high frequency coil 61. The coil shield 64 extends in the same direction as the high frequency coil 61, and is shaped so as to cover the high frequency coil 61 over the entire length of the high frequency coil 61.

An opening 640 is formed on the inner side of the coil shield 64, and this opening 640 allows high frequency waves to pass through, hereinafter this opening will be referred to as the high frequency wave passage opening. The high frequency wave passage opening 640 is formed over the entire length of the high frequency coil 61, so it is shaped as a spiral slit.

Figure 2:
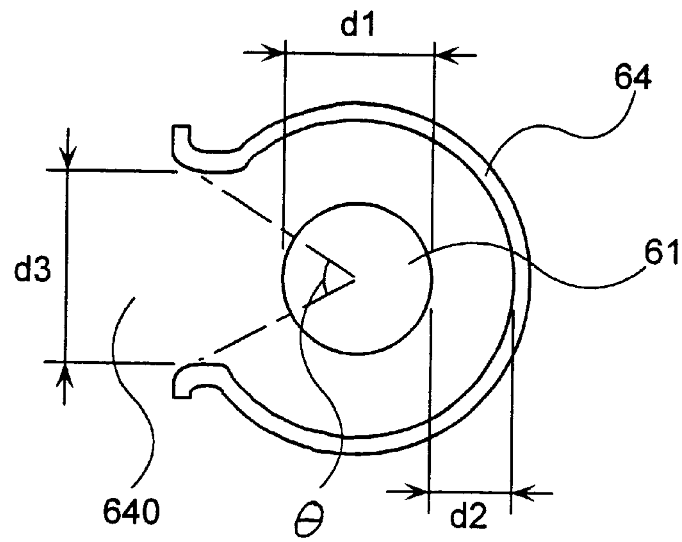
FIG. 2 is a diagram of the specific dimensions of the coil shield 64 used in the device shown in FIG. 1.

A specific example of the dimensions of the coil shield 64 will be given with reference to FIG. 2. FIG. 2 is a diagram of the specific dimensions of the coil shield 64 used in the device shown in FIG. 1.

When the thickness d1 of the high frequency coil 61 is about 10 mm, then the distance d2 between the coil shield 64 and the surface of the high frequency coil 61 is about 3 to 5 mm, and the width d3 of the high frequency wave passage opening 640 is about 10 mm. The size of the high frequency wave passage opening 640 is referred to as the allowance angle from the center of the thickness of the high frequency coil 61, and in this embodiment is about 70°.

The selection of the width d3 of this high frequency wave passage opening 640 is an important technological matter both in terms of the efficiency of plasma formation and of the diffusion of the plasma into the coil shield 64. In the sense of raising plasma formation efficiency by radiating more high frequency waves into the ionization space, it is preferable for the width d3 of the high frequency wave passage opening 640 to be large. If d3 is increased, however, then the problem of diffusion of the plasma into the coil shield 64 becomes more pronounced.

As d3 increases, the plasma diffuses into the coil shield 64 and produces a high frequency discharge inside the coil shield 64. This is just the same as in the case of a high frequency hollow discharge, but when discharge occurs within the coil shield 64, a great deal of high frequency wave energy is used up in said discharge. This means that not enough energy is supplied to the ionization space on the inner side of the high frequency coil 61, and as a result, the plasma formation efficiency decreases. The sputtering of the high frequency coil 61 also becomes more violent, resulting in the problem of damage to the high frequency coil 61.

Therefore, d3 should be made as large as possible to the extent that the plasma does not diffuse into the coil shield 64. This value will vary with the pressure and plasma density, so these parameters should also be taken into account.

This coil shield 64 is made of a metal such as stainless steel or aluminum, and is electrically grounded. The surfaces, both inner and outer sides, of the coil shield 64 are subjected to a surface treatment for heat resistance and plasma resistance, such as an alumite treatment.

Irregularities that prevent the accumulated thin film from falling off are formed on the inner surface of the coil shield 64, that is, the surface facing the high frequency coil 61. The surface of the high frequency coil 61 is sputtered by the plasma, and the sputtered material of the high frequency coil 61 builds up on the surface of the coil shield 64. Once this accumulated film has reached a certain amount, it falls off by its own weight and becomes dust particles. These dust particles float inside the sputter chamber, occasionally adhering to the substrate, and are a cause of substrate fouling. Irregularities are formed to enhance film adhesion so that the accumulated film on the surface of the coil shield 64 will not fall off so easily.

The operation of the ionizing sputtering device of this embodiment will now be described through reference to FIG. 1. The substrate 50 is conveyed through a gate valve, not shown, and into the sputter chamber 1, where it is placed on the substrate holder 5. The inside of the sputter chamber 1 has already been pumped down to about $10^{-8}$ to $10^{-9}$ Torr. After the substrate 50 is in place, the gas introduction means 4 is actuated, and a process gas, such as argon, is introduced at a constant flux. This process gas is used for sputter discharge, and is also used to form a plasma in the ionization space.

The pumping speed adjuster of the vacuum pump system 11 is controlled so as to maintain the inside of the sputter chamber 1 at about 30 to 40 mTorr, and the sputtering electrode 3 is actuated in this state. A constant voltage is imparted to the sputtering electrode 3 by the sputtering power source 35, which produces a magnetron sputter discharge.

At the same time, the ionization means 6 is also actuated by applying a high frequency voltage to the high frequency coil 61 by the high frequency power source 62, and a high frequency electric field is set up in the ionization space. The sputter discharge gas also diffuses into the ionization space, and the plasma P is formed when the sputter discharge gas undergoes electrolytic dissociation. The electric field establishment means 7 is also actuated at the same time by applying a specific bias voltage to the substrate 50 by the substrate-biasing high frequency power source 71, and an extraction-use electric field is set up between the plasma P and the substrate 50.

The target 2 is sputtered by the sputter discharge, and the sputtered titanium flies toward the substrate 50. In the course of this flight, the sputter particles are ionized as they pass through the plasma P in the ionization space. The ionized titanium is efficiently extracted from the plasma and directed at the substrate 50 by the extracting electric field. The titanium that lands on the substrate 50 reaches the bottom and side surfaces of the hole, builds up a film, and efficiently covers the inside of the hole.

When a film of the desired thickness has been produced, the electric field establishment means 7, ionization means 6, sputtering electrode 3, and gas introduction means 4 are turned off, and the substrate 50 is conveyed out of the sputter chamber 1.

In the above operation, the surface of the high frequency coil 61 is sputtered primarily by the ions of the process gas flying through the plasma P, and, in rare instances, by ions of the sputter particles. However, the sputter particles composed of the material of the high frequency coil 61 released by this sputtering are almost all blocked by the coil shield 64, and so they do not reach the substrate 50 or the target 2. The problem of fouling of the substrate 50 by the sputtered material of the high frequency coil 61 is virtually nonexistent in this embodiment. If any sputter particles composed of the material of the high frequency coil 61 adhere to the target 2, they may be re-sputtered and reach the substrate 50, so blocking is important not only for the substrate 50, but also for the target 2.

Even when the grounded coil shield 64 is provided on the outer side of the high frequency coil 61, high frequency waves of sufficient energy can be stored on the inner side of the high frequency coil 61.

Figure 3:
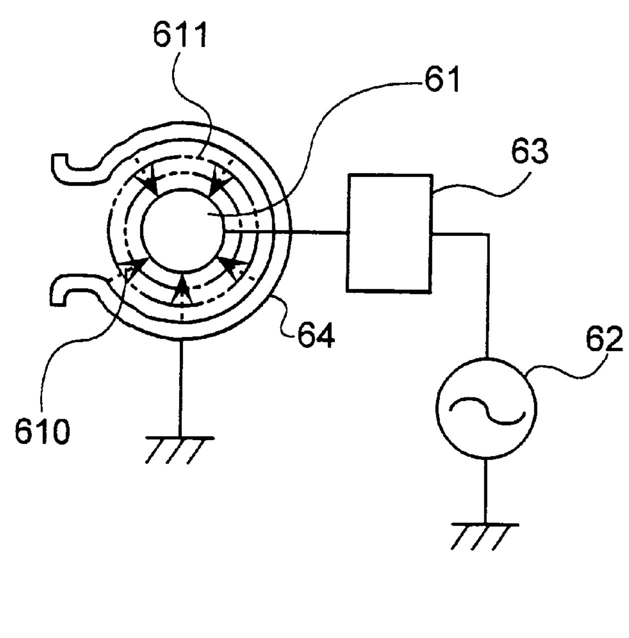
FIG. 3 is a simplified cross section of the state of the electric field inside the coil shield 64 in FIG. 1.

FIG. 3 is a simplified cross section of the state of the electric field inside the coil shield 64 in FIG. 1. The coil shield 64 has a circular cross section that is concentric with the cross section of the high frequency coil 61. The coil shield 64 itself is grounded. Electric power lines 610 carrying the high frequency voltage supplied to the high frequency coil 61 as shown in FIG. 3 fan out radially from the center point of the thickness of the high frequency coil 61 as shown in FIG. 3. The equipotential surface 611 that radiates from the high frequency coil 61 spreads out from the center in a concentric, circular form. The high frequency electric field is induced without disturbance within the coil shield 64, and high frequency waves radiate stably from the high frequency wave passage opening 640. As a result, a stable plasma can be formed in the ionization space.

Figure 4:
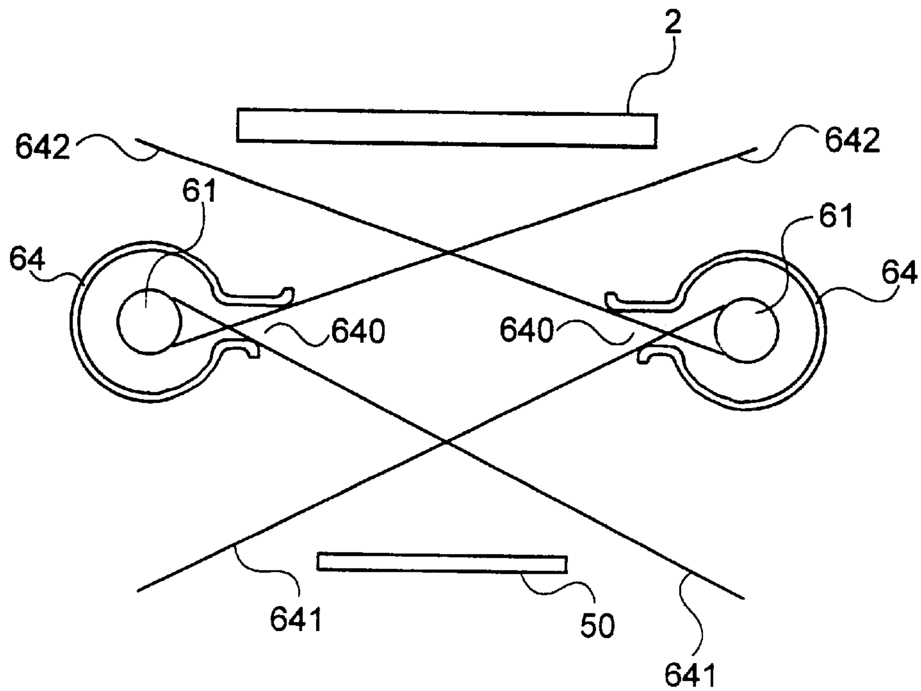
FIG. 4 is a simplified cross section of a favorable structure of the coil shield 64 in FIG. 1.

FIG. 4 is a simplified cross section of a favorable structure of the coil shield 64 in FIG. 1. As discussed above, the coil shield 64 covers the outside of the high frequency coil 61, and blocks the material of the high frequency coil 61 that was released by sputtering from reaching the substrate 50. For the blocking of the sputter particles of the high frequency coil 61 from the substrate 50 to be most effective, it is preferable for no point on the substrate 50 and no point on the sputtered surface of the target 2 to be visible from the coil shield 64 through the high frequency wave passage opening 640.

This will be described in specific terms through reference to FIG. 4. As one example, a high frequency wave passage opening 640 located on the upper right side in the figure will be described. As shown in FIG. 4, when a tangent 641 that passes by the lower edge of this high frequency wave passage opening 640 and is in contact with the upper surface of the high frequency coil 61, hereinafter referred to as the first tangent, passes to the outside of the left edge of the substrate 50, no point on the substrate 50 can be seen through this high frequency wave passage opening 640. Here, the substrate 50 is assumed to be circular.

When a tangent 642 that passes by the upper edge of the high frequency wave passage opening 640 and is in contact with the lower surface of the high frequency coil 61, hereinafter referred to as the second tangent, passes to the outside of the left edge of the sputtered surface of the target 2, no point on the sputtered surface of the target 2 can be seen through this high frequency wave passage opening 640. The "sputtered surface of the target 2" refers to the surface region of the target 2 sputtered exclusively by the sputtering electrode 3, excluding the surface region fixed to the target holder.

The same applies to the high frequency wave passage opening 640 positioned on the left side in FIG. 4. When the first tangent 641 passes to the outside of the right edge of the substrate 50, and the second tangent 642 passes to the outside of the right edge of the sputtered surface of the target 2, no point on the substrate 50 and no point on the sputtered surface of the target 2 can be seen through this high frequency wave passage opening 640.

The geometric arrangement of the high frequency wave passage opening 640 described above allows the most favorable effect to be obtained, namely, the blockage of the sputter particles from the high frequency coil 61 to the substrate 50. In terms of the passage efficiency of the high frequency waves, it is better for the high frequency wave passage opening 640 to be as large as possible, so an arrangement is sometimes employed in which the first tangent 641 is in contact with the edge of the substrate 50, and the second tangent 642 is in contact with the edge of the sputtered surface of the target 2.

Figure 5:
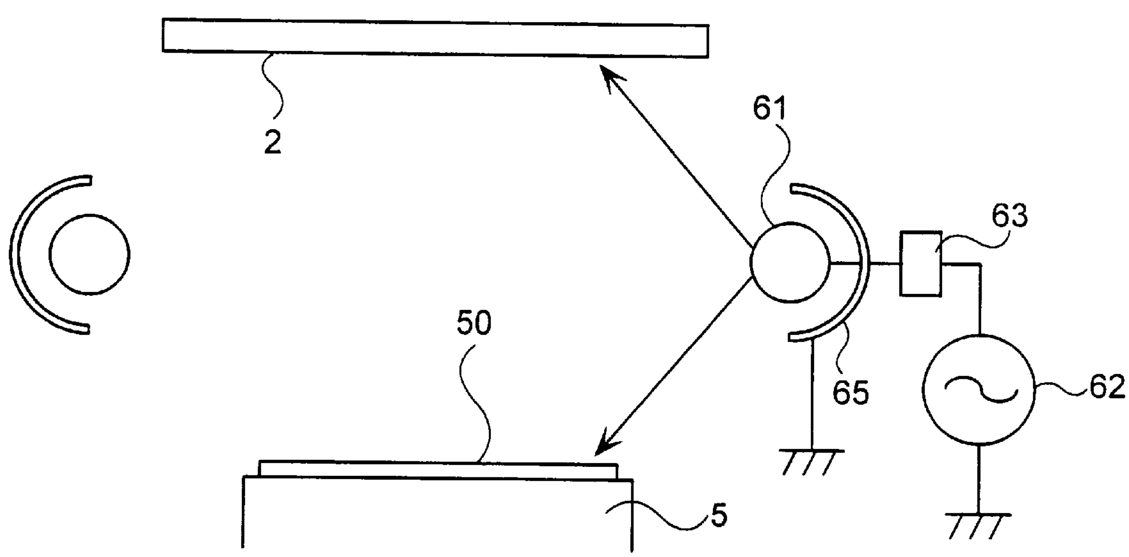
FIG. 5 is a simplified front view of the main structure of the ionizing sputtering device pertaining to a second embodiment of the present invention.

FIG. 5 is a simplified front view of the main structure of the ionizing sputtering device pertaining to the second embodiment of the present invention. In this second embodiment, the high frequency coil 61 is formed from the same material as the target 2, which is the material of the thin film to be formed on the substrate 50, and an auxiliary shield 65 is provided to the outside of the high frequency coil 61.

Having the high frequency coil 61 made of the same material as the target 2 solves the above-mentioned problem of fouling of the substrate 50 by the sputtered material of the high frequency coil 61 through a different approach from that in the first embodiment. With this approach, the high frequency coil 61 is formed from a material that will pose no problems if the material of the high frequency coil 61 adheres to the substrate 50. When a barrier film is to be produced, the target 2 is made of titanium, and the high frequency coil 61 is also made of titanium.

Since the high frequency coil 61 may be used up through sputtering over time, it should be attached inside the sputter chamber 1 in an easily exchangeable state.

The purpose of the auxiliary shield 65 on the outside of the high frequency coil 61 in the FIG. 5 embodiment is somewhat different from that of the coil shield 64 in the first embodiment. Since the high frequency coil 61 is made of the same material as the target 2, there is not as much need in this second embodiment for the sputter particles from the high frequency coil 61 to be blocked. The main purpose of this auxiliary shield 65 is to prevent energy supply outside of the high frequency coil 61, and thereby keep it inside the high frequency coil 61.

Without this auxiliary shield 65, the high frequency waves will radiate outside of the high frequency coil 61 as well, where they will impart energy to the gas molecules present on the outside of the high frequency coil 61, resulting in a discharge and forming a plasma on the outside of the high frequency coil 61. As it is formed, the plasma spreads from inside to outside the high frequency coil 61. A plasma formed outside the high frequency coil 61 is virtually useless at ionizing sputter particles from the target. When a plasma is thus formed in an unnecessary region, the members present in this region are subjected to unnecessary sputtering. With this embodiment, however, this problem is not encountered because plasma formation outside the high frequency coil 61 is suppressed by the auxiliary shield 65.

The auxiliary shield 65 shown in FIG. 4, just like the coil shield 64 shown in FIG. 3, has a circular cross section that is concentric with the center of the thickness of the high frequency coil 61. The surface of the auxiliary shield 65 that faces the high frequency coil 61 is shaped such that it conforms to the equipotential surface of the electric field radiated from the high frequency coil 61. The distribution of the electric field between the high frequency coil 61 and the auxiliary shield 65 is symmetric about the center, and this contributes to the establishment of a stable high frequency electric field in the ionization space.

The auxiliary shield 65, just like the coil shield 64, is formed from a metal such as stainless steel or aluminum, and is electrically grounded. The surface of the auxiliary shield 65 is treated with alumite, or is provided with irregularities that prevent accumulated film from falling off, and is the same in this respect as well.

Naturally, the coil shield 64 in the first embodiment given above has the same effect as this auxiliary shield 65. This auxiliary shield 65 may also be given an effect whereby it blocks the sputter particles from the high frequency coil 61, just as with the coil shield 64.

Figure 6:
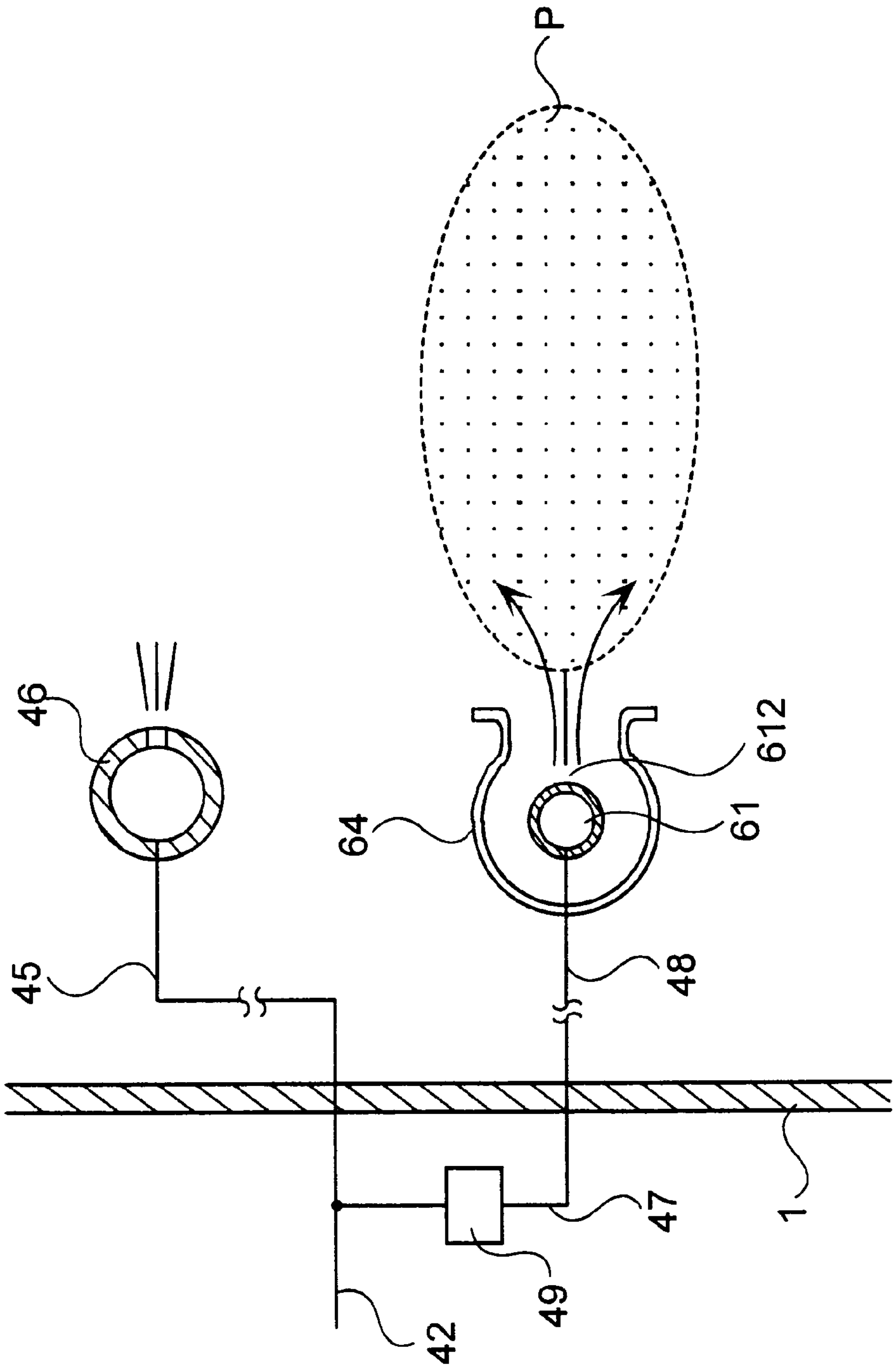
FIG. 6 is a simplified front view of the main structure of the ionizing sputtering device pertaining to the third embodiment of the present invention.

FIG. 6 is a simplified front view of the main structure of the ionizing sputtering device pertaining to a third embodiment of the present invention. The device of this third embodiment is the same as that of the first embodiment in that the coil shield 64 is provided, but is different in that the high frequency coil 61 has a function for introducing gas into the ionization space. Specifically, the high frequency coil 61 in the third embodiment is hollow, and gas blowing holes 612 are uniformly formed over the inner surface facing the ionization space.

The high frequency coil 61 comprises a pipe-shaped member with an inside diameter of 6 mm and an outside diameter of 10 mm that has been molded into a spiral shape. The gas blowing holes 612 are circular, about 0.2 mm in diameter, and can be provided at intervals of about 20 mm. If the gas blowing holes 612 are too large, there will be a problem of plasma infiltrating the interior of the high frequency coil 61 through the gas blowing holes 612, so they should not be too large.

This high frequency coil 61 is connected to the pipe 42 of the gas introduction means 4. An auxiliary pipe 47 is provided as a branch of the pipe 42, and an auxiliary in-chamber pipe 48 is connected to the auxiliary pipe 47. The high frequency coil 61 is connected to the distal end of the auxiliary in-chamber pipe 48. A gas which is the same as the gas introduced from the gas distributor 46 is introduced from the high frequency coil 61.

This structure of the high frequency coil 61 enhances the plasma formation efficiency by supplying more gas to the place where more high frequency energy is supplied. From the high frequency coil 61, the most high frequency energy is supplied to the ionization space on the inside, but with just the gas distributor 46, it is quite far from the gas distributor 46 to the ionization space, so there is the danger that the gas will diffuse prior to reaching the ionization space, and not enough gas will be supplied. On the other hand, if the gas is supplied from the gas blowing holes 612 in the high frequency coil 61, the ionization space will be right in front of the gas, and a sufficient amount of gas will be supplied. As a result, the plasma formation efficiency is higher.

As to the gas supply to the sputtering electrode 3, there are cases when the gas supply from the high frequency coil 61 is sufficient without a gas distributor 46 being used, in which case the gas distributor 46 and the in-chamber tube 45 are omitted.

A temperature adjuster 49 for the gas supplied to the high frequency coil 61 is provided to the auxiliary pipe 47 connected to the high frequency coil 61. In specific terms, the temperature adjuster 49 is a cooler that cools the gas to a specified temperature.

The high frequency coil 61 is heated by Joule heat that accompanies the high frequency current flowing to the surface, or electron impact from the plasma formed in the ionization space. If the high frequency coil 61 is heated beyond a limit, there will be problems in terms of thermal damage to the high frequency coil 61, or the promotion of film accumulation onto the high frequency coil 61.

In this embodiment, the gas supplied to the high frequency coil 61 is cooled to a desired temperature by the temperature adjuster 49, and the effect of this gas cooling is that the temperature of the high frequency coil 61 is kept from rising over the desired temperature. This keeps the high frequency coil 61 from being subjected to thermal damage or excessive film build-up.

The temperature adjuster 49 can also be used for purposes other than the cooling of the high frequency coil 61. For instance, if the temperature of the gas supplied to the ionization space should need to be adjusted for one reason or another, the temperature adjuster 49 can be used to advantage for this purpose.

It is also possible for the high frequency coil 61 in this third embodiment to be made of the same material as the target 2, just as in the second embodiment. It is also possible to employ the auxiliary shield 65 of the second embodiment instead of the coil shield 64.

A high frequency inductive coupling type of plasma was employed as the ionization means 6 in the above embodiments, but many other configurations are also feasible. For example, the means for forming a plasma can be one that forms a high frequency capacitive coupling type of plasma, a direct current diode discharge plasma, an electron cyclotron resonance (ECR) plasma, or a helicon wave excited plasma. In addition, an ion source that ionizes by irradiating the ionization space with positive ions to capture electrons from the sputter particles can also be employed as the ionization means 6.

In the above embodiments, the electric field establishment means 7 for setting up an electric field to extract the ionized sputter particles to the substrate 50 was used, but there are instances when the effect of ionizing sputtering will be obtained even if this electric field establishment means 7 is not provided. For instance, it is sometimes possible for the ions to be accelerated and effectively directed at the substrate 50 by the high frequency electric field imparted by the high frequency coil 61, in which case the electric field establishment means 7 is not needed.

In addition to the above-mentioned spiral shape, the structure of the high frequency coil 61 can also be a wound coil composed solely of a ring-shaped member, or a structure in which two (or three or more) ring-shaped members are disposed one above the other a specific distance apart and connected by connecting rods.

In addition to various semiconductor devices, the sputtering device of the present invention can also be utilized in the production of liquid crystal displays and various other electronic products.

As described above, with the present invention, almost all of the sputter particles composed of the material of the high frequency coil released by sputtering can be blocked by a coil shield. The sputter particles do not reach the substrate or target. Therefore, the problem of the fouling of the substrate by the sputtered material of the high frequency coil is eliminated. In addition, the ionizing sputtering effect can be further enhanced. Also, if the electric field inside the coil shield is symmetric about the center, the high frequency waves radiate more stably in the ionization space, and ionization can be performed more stably. The problem of fouling of the substrate by the material of the high frequency coil can be eliminated, and the formation of plasma in unnecessary places can be suppressed. In addition, the electric field inside the auxiliary shield 65 can be symmetric about the center, the merit of which is that high frequency waves radiate more stably in the ionization space, and ionization can be performed more stably. If more gas can be supplied to the ionization space where more high frequency energy is supplied, it is possible to raise the plasma formation efficiency. And, the high frequency coil may be cooled to the desired temperature, which keeps the high frequency coil from being subjected to thermal damage or excessive film build-up.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. An ionizing sputtering device, comprising:

a sputter chamber equipped with a vacuum pump system;

a target provided inside the sputter chamber;

a sputtering electrode for sputtering the target;

gas introduction means for introducing a gas into the sputter chamber;

ionization means for ionizing sputter particles released from the target by sputtering, the ionization means includes a high frequency coil having a periphery provided inside the sputter chamber so as to surround a space between the target and the substrate holder, and a high frequency power source that forms a high frequency inductive coupling type of plasma in the space by supplying high frequency waves to the high frequency coil;

a substrate holder for holding a substrate in a position where the sputter particles land; and a coil shield provided around the high frequency coil so as to cover the entire periphery of the high frequency coil except for a portion of the high frequency coil facing the space, the coil shield arranged so as to block the arrival at the substrate of sputter particles composed of the material of the high frequency coil that are sputtered and released by said high frequency coil.

2. The ionizing sputtering device as defined in claim 1, further comprising an electric field establishment means for setting up an electric field in a direction perpendicular to the substrate in order to pull the ionized sputter particles into the substrate.

3. The ionizing sputtering device as defined in claim 2, wherein the sputter particles are titanium.

4. The ionizing sputtering device as defined in claim 1, wherein the coil shield is shaped such that it covers the outside of the high frequency coil and is provided with an opening for the passage of high frequency waves to the inside of the high frequency coil so that the high frequency waves will radiate toward the ionization space, and is shaped such that no point on the substrate and no point on a sputtered surface of the target is visible from the high frequency coil through the opening for the passage of high frequency waves.

5. The ionizing sputtering device as defined in claim 1, wherein the coil shield is formed from a metal member and is electrically grounded, is positioned so as to cover part of the high frequency coil, and is formed such that a surface of the coil shield facing the high frequency coil has a shape that follows an equipotential surface of an electric field radiated from the high frequency coil.

6. An ionizing sputtering device, comprising:

a sputter chamber equipped with a vacuum pump system;

a target provided inside the sputter chamber;

a sputtering electrode for sputtering the target;

gas introduction means for introducing a gas into the sputter chamber;

ionization means for ionizing sputter particles released from the target by sputtering, the ionization means includes a high frequency coil having a cross section provided inside the sputter chamber so as to surround a space between the target and the substrate holder, and a high frequency power source that forms a high frequency inductive coupling type of plasma in the space by supplying high frequency waves to the high frequency coil;

a substrate holder for holding a substrate in a position where the sputter particles land; and a coil shield provided around the high frequency coil, the coil shield having a cross section that is concentric with the high frequency coil cross section except at a portion of the high frequency coil facing the space, the coil shield arranged so as to block the arrival at the substrate of sputter particles composed of the material of the high frequency coil that are sputtered and released by said high frequency coil.

7. The ionizing sputtering device as defined in claim 6, further comprising an electric field establishment means for setting up an electric field in a direction perpendicular to the substrate in order to pull the ionized sputter articles into the substrate.

8. The ionizing sputtering device as defined in claim 7, wherein the sputter particles are titanium.

9. The ionizing sputtering device as defined in claim 6, wherein the coil shield is formed from a metal member and is electrically grounded, is positioned so as to cover part of the high frequency coil, and is formed such that a surface of the coil shield facing the high frequency coil has a shape that follows an equipotential surface of an electric field radiated from the high frequency coil.

10. The ionizing sputtering device as defined in claim 6, wherein the coil shield is shaped such that it covers an outer periphery of the high frequency coil and is provided with an opening for the passage of high frequency waves to the space so that the high frequency waves will radiate toward the space, and is shaped such that no point on the substrate and no point on a sputtered surface of the target is visible from the high frequency coil through the opening for the passage of high frequency waves.

11. The ionizing sputtering device as defined in claim 6, wherein the high frequency coil cross section is circular.

12. An ionizing sputtering device, comprising:

a sputter chamber equipped with a vacuum pump system;

a target provided inside the sputter chamber;

a sputtering electrode for sputtering the target;

gas introduction means for introducing a gas into the sputter chamber;

ionization means for ionizing sputter particles released from the target by sputtering, the ionization means includes a high frequency coil having a periphery provided inside the sputter chamber so as to surround a space between the target and the substrate holder, and a high frequency power source that forms a high frequency inductive coupling type of plasma in the space by supplying high frequency waves to the high frequency coil;

a substrate holder for holding a substrate in a position where the sputter particles land; and a coil shield provided around the periphery of the high frequency coil except for a portion of the periphery facing the space, the coil shield having a circular cross section that is concentric with a cross section of the high frequency coil except in the portion of the coil periphery facing the space, the coil shield arranged so as to block the arrival at the substrate of sputter particles composed of the material of the high frequency coil that are sputtered and released by said high frequency coil.

13. The ionizing sputtering device as defined in claim 12, further comprising an electric field establishment means for setting up an electric field in a direction perpendicular to the substrate in order to pull the ionized sputter particles into the substrate.

14. The ionizing sputtering device as defined in claim 13, wherein the sputter particles are titanium.

15. The ionizing sputtering device as defined in claim 12, wherein the coil shield is formed from a metal member and is electrically grounded, is positioned so as to cover part of the high frequency coil, and is formed such that a surface of the coil shield facing the high frequency coil has a shape that follows an equipotential surface of an electric field radiated from the high frequency coil.

16. The ionizing sputtering device as defined in claim 12, wherein the coil shield is shaped such that it covers an outer periphery of the high frequency coil and is provided with an opening for the passage of high frequency waves to the space so that the high frequency waves will radiate toward the space, and is shaped such that no point on the substrate and no point on a sputtered surface of the target is visible from the high frequency coil through the opening for the passage of high frequency waves.

* * * * *